(12) United States Patent
Jiang et al.

(10) Patent No.: US 9,530,808 B2
(45) Date of Patent: Dec. 27, 2016

(54) TFT ARRAY SUBSTRATE, MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaohui Jiang, Beijing (CN); Jiaxiang Zhang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/387,686

(22) PCT Filed: Dec. 9, 2013

(86) PCT No.: PCT/CN2013/088906
§ 371 (c)(1),
(2) Date: Sep. 24, 2014

(87) PCT Pub. No.: WO2015/035715
PCT Pub. Date: Mar. 19, 2015

(65) Prior Publication Data
US 2015/0069402 A1    Mar. 12, 2015

(30) Foreign Application Priority Data
Sep. 12, 2013 (CN) .......................... 2013 1 0415138

(51) Int. Cl.
*H01L 27/12* (2006.01)
*H01L 29/66* (2006.01)

(52) U.S. Cl.
CPC ..... *H01L 27/1288* (2013.01); *H01L 29/66765* (2013.01)

(58) Field of Classification Search
CPC ........... H01L 27/1288; H01L 29/66765; H01L 29/78678; H01L 29/78669; H01L 27/1214
See application file for complete search history.

(56) References Cited

U.S. PATENT DOCUMENTS 5,477,355 A * 12/1995 Sasaki et al. .................. 349/42
7,776,662 B2 * 8/2010 Wang et al. .................. 438/149
(Continued)

FOREIGN PATENT DOCUMENTS

CN     101078842 A     11/2007
CN     101078843 A     11/2007
(Continued)

OTHER PUBLICATIONS

International Search Report, International Preliminary Report on Patentability and Written Opinion of the International Searching Authority of PCT/CN2013/088906 in Chinese, mailed Jun. 4, 2014.
(Continued)

*Primary Examiner* — Tucker J Wright
(74) *Attorney, Agent, or Firm* — Collard & Roe, P.C.

(57) ABSTRACT

A method of manufacturing a TFT array substrate and a TFT array substrate and a display device are provided. During a pattern of a gate layer (2), a pattern of the gate insulating layer (3) and a pattern of the active layer are made, a gate layer (2) material, a gate insulating layer (3) material and an active layer material are deposited successively. The gate layer (2), the gate insulating layer (3) and the active layer are made through one patterning process. At least one mask process is saved and the process complexity is reduced.

8 Claims, 4 Drawing Sheets

(56) References Cited

U.S. PATENT DOCUMENTS

| | | | |
|---|---|---|---|
| 2001/0035527 A1* | 11/2001 | Tanaka et al. | 257/59 |
| 2001/0053570 A1* | 12/2001 | Kido | 438/149 |
| 2002/0104992 A1* | 8/2002 | Tanabe et al. | 257/48 |
| 2002/0187592 A1* | 12/2002 | Wong | 438/149 |
| 2004/0197966 A1 | 10/2004 | Cho et al. | |
| 2005/0142681 A1* | 6/2005 | Soh | 438/30 |
| 2005/0263769 A1* | 12/2005 | Chul Ahn | 257/72 |
| 2007/0166856 A1* | 7/2007 | Lee | 438/30 |
| 2007/0246707 A1 | 10/2007 | Deng et al. | |
| 2007/0269937 A1* | 11/2007 | Lin | 438/149 |
| 2007/0272926 A1 | 11/2007 | Deng et al. | |
| 2008/0105873 A1* | 5/2008 | Wang et al. | 257/59 |
| 2008/0111136 A1* | 5/2008 | Qiu et al. | 257/72 |
| 2009/0008645 A1* | 1/2009 | Yamazaki et al. | 257/59 |
| 2009/0176325 A1* | 7/2009 | Jeon et al. | 438/34 |
| 2009/0218571 A1* | 9/2009 | Chen et al. | 257/59 |
| 2012/0138921 A1* | 6/2012 | Endo et al. | 257/43 |
| 2012/0188478 A1* | 7/2012 | Kuwabara | 349/43 |
| 2012/0241748 A1* | 9/2012 | Fujii | 257/59 |
| 2012/0249936 A1* | 10/2012 | Zi et al. | 349/106 |
| 2012/0289006 A1* | 11/2012 | Yuan | 438/158 |
| 2013/0043474 A1* | 2/2013 | Tang et al. | 257/59 |
| 2013/0071962 A1 | 3/2013 | Qin | |
| 2014/0077207 A1* | 3/2014 | Gao et al. | 257/43 |
| 2015/0014692 A1* | 1/2015 | Wu | 257/72 |

FOREIGN PATENT DOCUMENTS

| | | |
|---|---|---|
| CN | 101587861 A | 11/2009 |
| CN | 102299104 A | 12/2011 |
| CN | 102629569 A | 8/2012 |
| WO | 20131040809 A1 | 3/2013 |

OTHER PUBLICATIONS

Chinese Office Action of Chinese Application No. 201310415138.3, mailed Jan. 6, 2015 with English translation.
English Translation of the International Search Report of PCT/CN2013/088906 published in English on Mar. 19, 2015.
Second Chinese Office Action of Chinese Application No. 201310415138.3, mailed Jun. 3, 2015 with English translation.
English translation of the International Preliminary Report on Patentability and Written Opinion of the International Searching Authority of PCT/CN2013/088906, issued Mar. 15, 2016.

* cited by examiner

TFT ARRAY SUBSTRATE, MANUFACTURING METHOD THEREOF, AND DISPLAY DEVICE

CROSS REFERENCE TO RELATED APPLICATIONS

This application is the National Stage of PCT/CN2013/088906filed on Dec. 9, 2014, which claims priority under 35 U.S.C. §119 of Chinese Application No. 201310415138.3 filed on Sep. 12, 2013, the disclosure of which is incorporated by reference.

TECHNICAL FIELD

Embodiments of the present invention relate to a TFT array substrate and a manufacturing method thereof and a display device.

BACKGROUND

Thin Film Transistor Liquid Crystal Display (TFT-LCD) is the only one display which can compete with CRT in luminance, contrast, power consumption, life, cubage and weight. Since the TFT-LCD is developed, it is widely interested. Therefore, people have proposed higher and higher requirement on its performance. The TFT-LCD having high resolution and low power consumption becomes a hot topic.

During manufacturing the TFT array substrate, firstly, a pattern of gate layer is formed through one mask, and a pattern of active layer is formed through another mask, and the process is complicated due to multiple masks. Therefore, it needs a process having simple manufacturing procedures.

SUMMARY

Embodiments of the present invention provide a method of manufacturing TFT array substrate and a TFT array substrate and a display device for simplifying the manufacturing procedures.

Embodiments of the present invention provide a method of manufacturing TFT array substrate. The method comprises depositing successively a gate layer material, a gate insulating layer material and an active layer material on the substrate; forming a gate layer and an active layer through one patterning and remaining mask pattern of active layer region; depositing the gate insulating layer material again; and removing remained mask pattern.

The gate layer, gate insulating layer and the active layer are made through one patterning, it saves at least one mask process and reduces the process complexity.

In an example, forming of the gate layer pattern and the active layer pattern through one patterning and remaining of the mask pattern of the active layer region comprises: forming the gate layer and the active layer by using a half-tone or gray-tone mask, wherein the gate insulating layer material under the active layer region is remained and the mask pattern on the active layer region is remained.

The method further comprises depositing indium tin oxide layer after removing the remained mask pattern, and forming a pixel electrode and a via hole of the gate insulating layer through one patterning In an example, the method further comprises forming a pattern of source and drain metal layer, a passivation layer and a common electrode after forming the pixel electrode by etching the exposed indium tin oxide.

In an example, the gate layer material comprises molybdenum, molybdenum alloy, aluminum, aluminum alloy, copper, copper alloy, chromium or chromium alloy.

In an example, the active layer comprises an amorphous silicon layer and an ohmic contact layer.

In an example, the indium tin oxide layer has a thickness of 400-600 angstrom.

In an example, forming of the pattern of source and drain metal layer comprises: depositing a source and drain metal layer; and performing a wet etching and etching the ohmic contact layer after a masking process so as to form the pattern of source and drain metal layer.

Embodiments of the present invention provide a TFT array substrate. The TFT array substrate comprises: a substrate; a gate layer provided on the substrate; a gate insulating layer provided on the gate layer; and an active layer provided on the gate insulating layer; wherein the region of the gate insulating layer that is under the active layer and the other region of the gate insulating layer are formed through two depositing.

In an example, forming of the gate insulating layer through two depositing comprises: forming the gate layer and the active layer by using a half-tone or gray-tone mask, wherein the gate insulating layer material under the active layer region is remained and the mask pattern in the active layer region is remained; depositing the gate insulating layer material again; and removing the remained mask pattern.

In an example, the TFT array substrate further comprises: an pixel electrode provided on the active layer and the gate insulating layer; and a via hole of the gate insulating layer provided on the gate layer; wherein the pixel electrode and the via hole of the gate insulating layer are formed through one patterning.

In an example, the TFT array substrate further comprises a pattern of source and drain metal layer, a passivation layer and a common electrode.

In an example, the gate layer material comprises molybdenum, molybdenum alloy, aluminum, aluminum alloy, copper, copper alloy, chromium or chromium alloy.

In an example, the active layer comprises an amorphous silicon layer and an ohmic contact layer.

In an example, the indium tin oxide layer has a thickness of 400-600 angstrom.

Embodiments of the present invention further provide a display device comprising the TFT array substrate.

BRIEF DESCRIPTION OF THE DRAWINGS

Embodiments of the present invention will be described in more detail below with reference to the accompanying drawings to allow one of ordinary skill in the art to understand the present invention more clearly, in which.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and when the position of the object which is described is changed, the relative position relationship may be changed accordingly.

Embodiments of the present invention provide a method of manufacturing a TFT array substrate and a TFT array substrate and a display device; during a pattern of a gate layer, a pattern of a gate insulating layer and a pattern of an active layer are made, a gate layer material, a gate insulating layer material and an active layer material are deposited successively; the gate layer, the gate insulating layer and the active layer are made through one patterning process. At least one mask process is saved and the process complexity is reduced.

Figure 1:
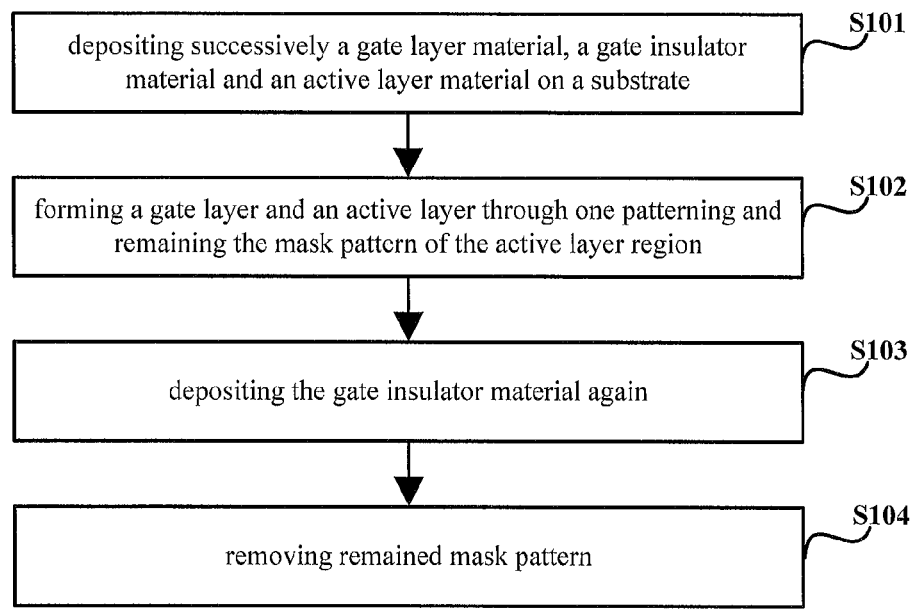
FIG. 1 is a flowchart of the method of manufacturing a TFT array substrate according to an embodiment of the present invention.

As shown in FIG. 1, the embodiment of the present invention provides a method of manufacturing a TFT array substrate, the method comprises the following steps.

Step S101, a gate layer material, a gate insulating layer material and an active layer material are deposited successively on a substrate.

Step S102, a gate layer and an active layer are formed through one patterning and the mask pattern in the active layer region is left.

Step S103, the gate insulating layer material is deposited again.

Step S104, the remained mask pattern is removed.

The active layer comprises an amorphous silicon layer and an ohmic contact layer.

The amorphous silicon layer and the ohmic contact layer are successively deposited so as to achieve the deposition of the active layer. The gate layer material may employ molybdenum, molybdenum alloy, aluminum, aluminum alloy, copper, copper alloy, chromium or chromium alloy.

The above steps can used to make the pattern of gate layer and the pattern of active layer through one masking process.

In step S102, the gate and active layer may be formed by using a half-tone or gray-tone mask, wherein the gate insulating layer material under the active layer region is remained and the mask pattern in the active layer region is remained.

For example, firstly, the half-tone masking process is performed, wherein the mask pattern is configured that the active layer region is opaque, the gate region is partially light-transmissive, and the other regions are fully light-transmissive. An ashing process is performed to the mask pattern after the etching is performed. The exposed active layer material and the gate insulating layer are etched off to form the gate layer and the active layer. Furthermore, the gate insulating layer material under the active layer region is remained and the mask pattern in the active layer region is remained.

Figure 2:
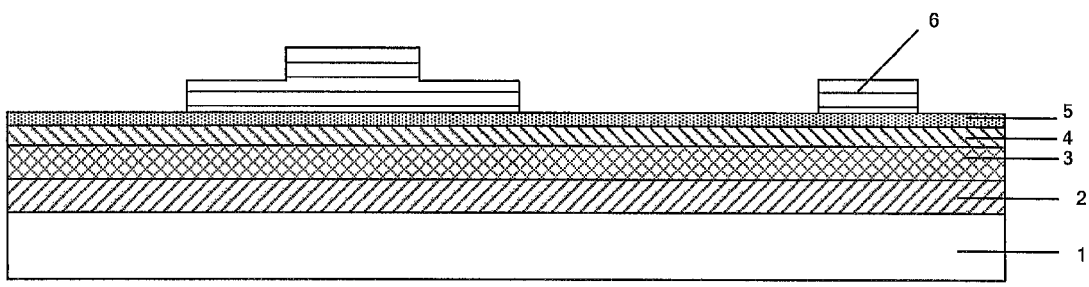
FIG. 2 is a schematic structural view of the TFT array substrate undergone a half-tone masking process during manufacturing a pattern of the gate layer pattern and a pattern of the active layer according to an embodiment of the present invention.

As shown in FIG. 2, corresponding to the method described in FIG. 1, after the gate layer 2, the gate insulating layer 3, the amorphous silicon layer 4 and the ohmic contact layer 5 are successively deposited on the substrate 1, the half-tone masking process is performed. The mask pattern 6 is opaque in the active layer region, partially light-transmissive in the gate region and fully light-transmissive in the other regions. The mask in the partially light-transmissive region has a thickness less than that in the opaque region.

Figure 3:
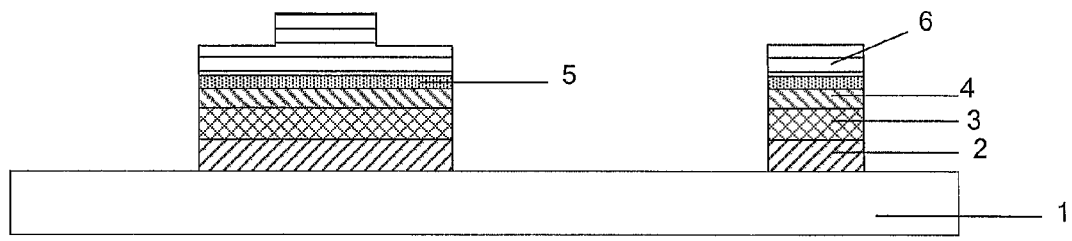
FIG. 3 is a schematic structural view of the TFT array substrate undergone a first etching during manufacturing a pattern of the gate layer and a pattern of the active layer according to an embodiment of the present invention.
Figure 4:
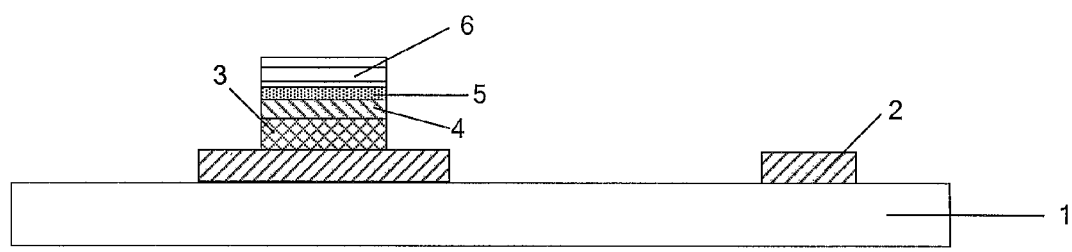
FIG. 4 is a schematic structural view of the TFT array substrate undergone a second etching during manufacturing a pattern of the gate layer and a pattern of the active layer according to an embodiment of the present invention.
Figure 5:
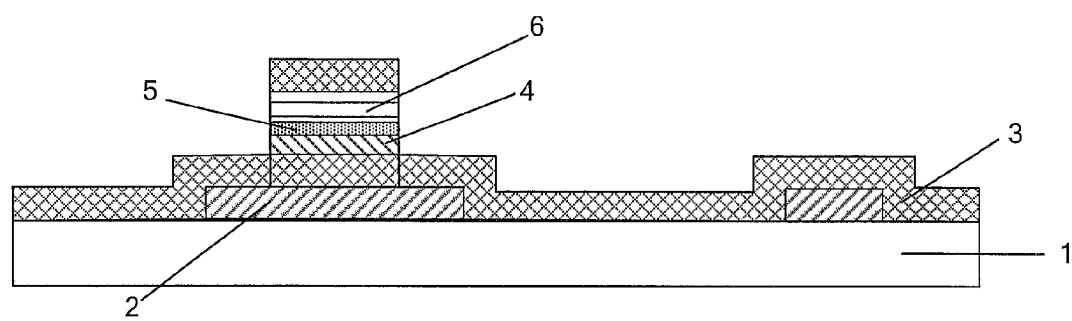
FIG. 5 is a schematic structural view of the TFT array substrate undergone a second depositing of the gate insulating layer material during manufacturing a pattern of the gate layer and a pattern of the active layer according to an embodiment of the present invention.

The light-transmissive region is etched to from the structure as shown in FIG. 3, then the ashing process is performed to the mask pattern 6 so as to expose the active layer material of the non-active layer region, and the active layer region is still covered by the mask pattern. The exposed active layer material is etched to form the structure as shown in FIG. 4. The gate insulating layer material is deposited again to form the structure as shown in FIG. 5. The remained mask pattern is removed; when the mask pattern is removed, the gate insulating layer material on the mask pattern is removed together with the mask pattern to form the structure as shown in FIG. 6.

Figure 6:
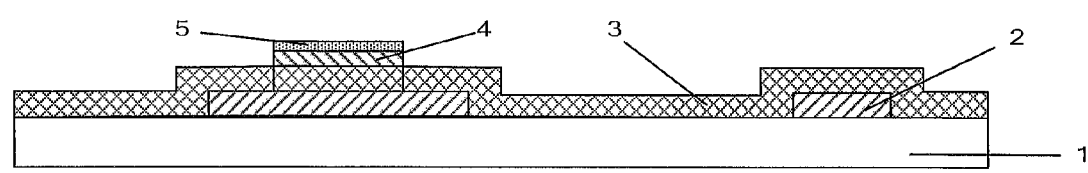
FIG. 6 is a schematic structural view of the TFT array substrate undergone removing mask pattern during manufacturing a pattern of the gate layer and a pattern of the active layer according to an embodiment of the present invention.

A pixel electrode, a source and drain, a passivation layer and a common electrode are made on the structure as shown in FIG. 6 so that the substrate array is made.

As the resolution of product is improved and a narrow bezel is required, the pixel size becomes smaller and smaller so that the precision of the peripheral wiring becomes higher and higher. The size of a via hole is one of standards that evaluate the precision of the peripheral wiring. To reduce the size of a peripheral via hole, in the procedure of manufacturing the TFT array substrate, a via hole of the gate insulating layer is made by etching (which functions as directly communicating the source and drain metal with the gate metal in the peripheral circuit, ESD regions or the like) after the gate layer and the active layer is made, then the source and the drain, the pixel electrode, the passivation layer and the common electrode are made. As can be seen from above procedures, the conventional product process needs seven times masking process.

To further reducing the times of masking process, the pixel electrode and the via hole of the gate insulating layer are formed through one mask. After removing the remained mask pattern, an indium tin oxide layer is deposited, and the pixel electrode and the via hole of the gate insulating layer are formed through one patterning process.

Figure 7:
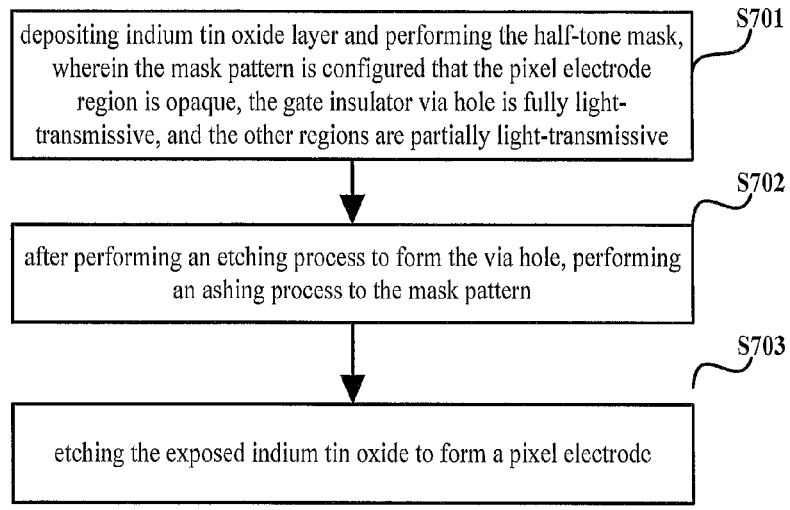
FIG. 7 is another flowchart of the method for manufacturing a TFT array substrate according to an embodiment of the present invention.

For example, the pixel electrode and the via hole of the gate insulating layer can be formed through a half-tone or gray-tone mask process. As shown in FIG. 7, after the remained mask pattern is removed, following steps are performed.

Figure 8:
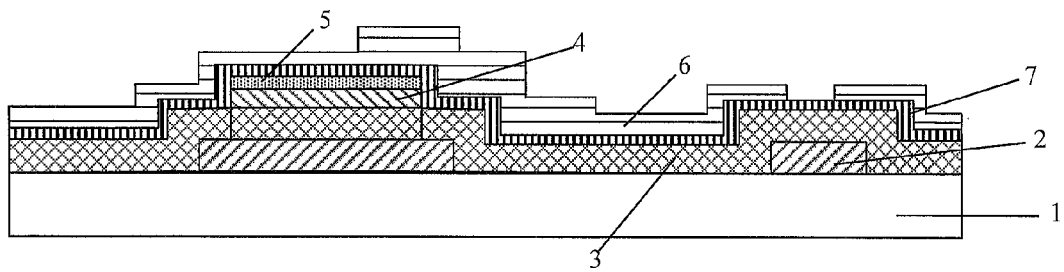
FIG. 8 is a schematic structural view of the TFT array substrate undergone a half-tone masking process during manufacturing a pixel electrode and a via hole of the gate insulating layer according to an embodiment of the present invention.

Step S701: an indium tin oxide layer is deposited and a half-tone mask is applied. The mask pattern is configured that the pixel electrode region is opaque, the via hole of the gate insulating layer (GI via hole) is fully light-transmissive, and other regions are partially light-transmissive. The array substrate is shown as in FIG. 8, which comprises the indium tin oxide layer 7 and the mask pattern 6.

Figure 9:
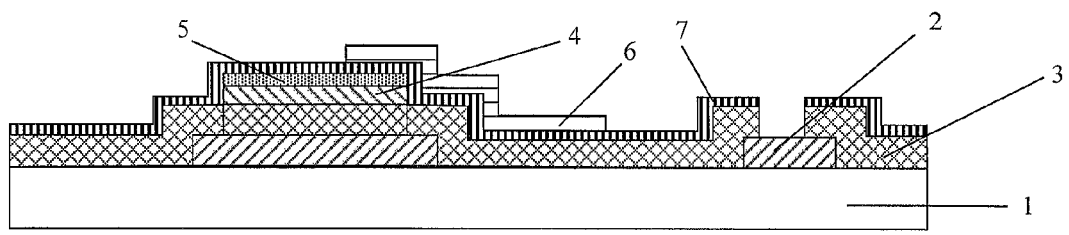
FIG. 9 is a schematic structural view of the TFT array substrate undergone aching process during manufacturing a pixel electrode and a via hole of the gate insulating layer according to an embodiment of the present invention.

Step S702: after an etching process is performed to form the GI via hole, then an ashing process is performed to the mask pattern, the formed array substrate is shown as in FIG. 9.

Step S703: the exposed indium tin oxide is etched to form the pixel electrode. After the remained mask pattern is removed, the array substrate is shown as in FIG. 10.

In the step S702, when the GI via hole is formed through etching, to improve process efficiency, firstly, a wet etching process can be used to remove the indium tin oxide (ITO) on the GI via hole region, then a dry etching process is used to remove the gate insulating layer material on the GI via hole region.

In the step S701, the deposited indium tin oxide layer can have a thickness of 400-600 angstrom.

In the embodiments of the present invention, the mask pattern can comprise a photoresist mask pattern or a photoresistive resin mask pattern. In the practical application, other suitable material can be used to achieve a mask.

After the exposed indium tin oxide is etched to form the pixel electrode, a pattern of the source and drain metal layer, the passivation layer and the common electrode are formed to complete the manufacture of the array substrate.

Figure 11:
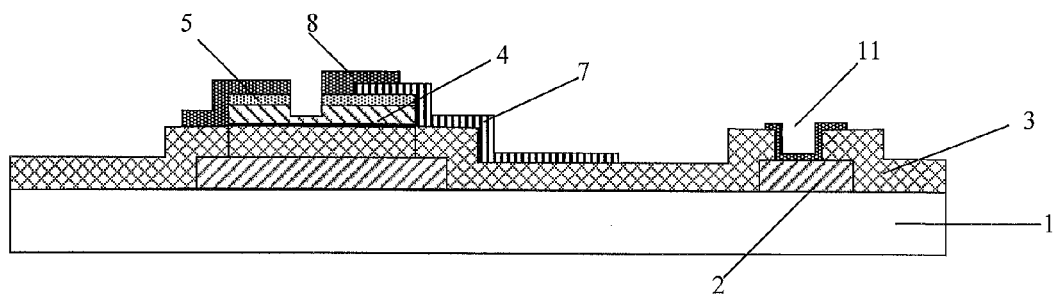
FIG. 11 is a schematic structural view of the TFT array substrate formed with a pattern of source and drain metal layer according to an embodiment of the present invention.

For example, the step of forming the source and drain metal layer comprises depositing source and drain metal layer, and after a masking process, performing an wet etching process and etching the ohmic contact layer, so as to form a pattern 8 of the source and drain metal layer as shown in FIG. 11.

Figure 12:
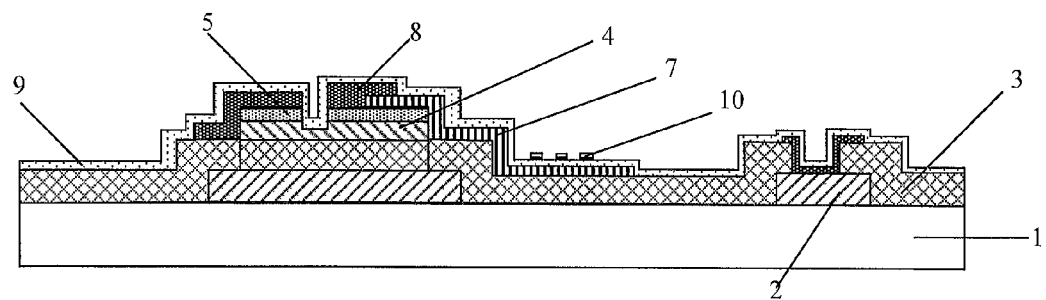
FIG. 12 is a schematic structural view of the TFT array substrate formed with a passivation layer and a common electrode according to an embodiment of the present invention.

As shown in FIG. 12, after the passivation layer and the common electrode are made through depositing, the manufacture of the TFT array substrate is completed.

According to embodiments of the present invention, a TFT array substrate is provided, which is made through the method provided by the embodiments of the present invention.

As shown in FIG. 6, the TFT array substrate provided by the embodiments of the present application comprises: a substrate 1, a gate layer 2 arranged on the substrate 1; a gate insulating layer 3 arranged on the gate layer 2; and an active layer arranged on the gate insulating layer 3 (the active layer of FIG. 6 comprises an amorphous silicon layer 4 and an ohmic contact layer 5).

The region of the gate insulating layer 3 that is under the active layer and the other region of the gate insulating layer 3 are formed through two depositing. The gate insulating layer 3 is formed through two depositing, so that the gate layer 2 and the active layer can be formed through one patterning process. At least one masking process is saved, thereby the process complexity is reduced.

The step of forming gate insulating layer through two depositing comprise: forming a gate layer 2 and an active layer by using a half-tone or gray-tone mask, wherein the gate insulating layer material under the active layer region is remained and the mask pattern in the active layer region is remained; depositing the gate insulating layer material again; and removing the remained mask pattern.

The region of the gate insulating layer under the active layer and the other regions of the gate insulating layer are formed through two depositing, so that the gate layer and the active layer can be made through one patterning process. At least one mask process is saved and the process complexity is reduced.

Figure 10:
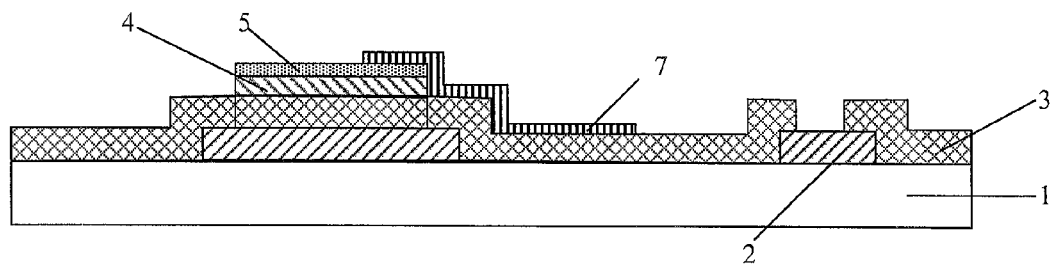
FIG. 10 is a schematic structural view of the TFT array substrate undergone removing mask pattern during manufacturing a pixel electrode and a via hole of the gate insulating layer according to an embodiment of the present invention.

For example, as shown in FIG. 10, the array substrate comprises: a pixel electrode 7 arranged on the active layers 4, 5 and the gate insulating layer layer 3; a via hole of the gate insulating layer 11 on the gate layer 2; wherein the pixel electrode 7 and the via hole of the gate insulating layer 11 are formed through one patterning process.

For example, as shown in FIG. 12, the array substrate comprises: a pattern 8 of source and drain metal layer; a passivation layer 9 and a common electrode 10.

For example, the gate layer material can comprise molybdenum, molybdenum alloy, aluminum, aluminum alloy, copper, copper alloy, chromium or chromium alloy.

As shown in FIG. 6, the active layer comprises an amorphous silicon layer 4 and an ohmic contact layer 5.

For example, the indium tin oxide layer has a thickness of 400-600 angstrom.

According to embodiments of the present invention, a display device is provided, which comprises the TFT array substrate provided by the embodiments of the present invention.

The embodiments of the present invention provide a method of manufacturing a TFT array substrate and a TFT array substrate and a display device. When the patterns of the gate layer, the gate insulating layer and the active layer are made, the gate layer material, the gate insulating layer material and the active layer material are deposited successively. The gate layer, the gate insulating layer and the active layer are made through one patterning process, thus at least one mask process is saved and the process complexity is reduced.

It is understood that the described above are only illustrative embodiments and implementations for explaining the principle of the present invention, and the present invention is not intended to limited thereto. For one of ordinary skill in the art, various modifications and improvements may be made without departing from the spirit and scope of embodiments of the present invention, and all of which should fall within the protection scope of the present invention.

What is claimed is:

1. A method of manufacturing a TFT array substrate, comprising:
    depositing successively a gate layer material, a gate insulating layer material and an active layer material on a substrate;
    forming a gate layer and an active layer through one patterning process, and remaining a mask pattern in the active layer region;
    then depositing the gate insulating layer material again;
    removing the remained mask pattern; and
    depositing an indium tin oxide layer after removing the remained mask pattern, and forming a pixel electrode and a via hole of the gate insulating layer through one patterning process;
    wherein the method further comprising forming a pattern of source and drain metal layer, a passivation layer and a common electrode after forming the pixel electrode and the via hole of the gate insulating layer.

2. The method according to claim 1, wherein forming a gate layer and an active layer through one patterning process and remaining mask pattern in the active layer region comprises:
    forming the gate layer and the active layer by using a half-tone or gray-tone mask, wherein the gate insulating layer material under the active layer region is remained and the mask pattern in the active layer region is remained.

3. The method according to claim 1, wherein forming the pattern of source and drain metal layer comprises:
    depositing a source and drain metal layer; and
    performing a wet etching and etching an ohmic contact layer after a masking process so as to form the pattern of source and drain metal layer.

4. The method according to claim 1, wherein forming the pattern of source and drain metal layer comprises:
    depositing a source and drain metal layer; and
    performing a wet etching and etching an ohmic contact layer after a masking process so as to form the pattern of source and drain metal layer.

5. A TFT array substrate, comprising:
    a substrate;
    a gate layer provided on the substrate;
    a gate insulating layer provided on the gate layer; and
    an active layer provided on the gate insulating layer;
    wherein the gate insulating layer includes a region under the active layer and a region other than the region under the active layer, the two regions are formed on the same layer and flushed with each other, and a vertical interface is formed between the two regions and extended along an end of the active layer.

6. A display device, comprising the TFT array substrate according to claim 5.

7. The TFT array substrate according to claim 5, further comprising:
    a pixel electrode provided on the active layer and the gate insulating layer; and
    a via hole of the gate insulating layer provided on the gate layer;
    wherein the pixel electrode and the via hole of the gate insulating layer are formed through one patterning process.

8. The TFT array substrate according to claims 5, further comprising a passivation layer and common electrode.

* * * * *